United States Patent
Warnes et al.

(10) Patent No.: US 8,892,942 B2
(45) Date of Patent: Nov. 18, 2014

(54) RANK SPARING SYSTEM AND METHOD

(75) Inventors: Lidia Warnes, Roseville, CA (US); Michael Bozich Calhoun, Roseville, CA (US); Dennis Carr, Roseville, CA (US); Teddy Lee, Roseville, CA (US); Dan Vu, Elk Grove, CA (US); Ricardo Ernesto Espinoza-Ibarra, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2074 days.

(21) Appl. No.: 11/878,860

(22) Filed: Jul. 27, 2007

(65) Prior Publication Data

US 2009/0031078 A1    Jan. 29, 2009

(51) Int. Cl.
| | |
|---|---|
| G06F 11/00 | (2006.01) |
| G11C 29/42 | (2006.01) |
| G11C 29/44 | (2006.01) |
| G11C 5/04 | (2006.01) |
| G11C 11/401 | (2006.01) |
| G11C 29/04 | (2006.01) |

(52) U.S. Cl.
CPC G11C 5/04 (2013.01); G11C 29/42 (2013.01); G11C 11/401 (2013.01); G11C 2029/0407 (2013.01); G11C 29/44 (2013.01)
USPC .............................................. 714/8

(58) Field of Classification Search
USPC .............................................. 714/8
See application file for complete search history.

(56) References Cited

U.S. PATENT DOCUMENTS

| | | | |
|---|---|---|---|
| 5,321,697 A * | 6/1994 | Fromm et al. ................ | 714/7 |
| 5,781,717 A * | 7/1998 | Wu et al. ..................... | 714/8 |
| 5,867,642 A * | 2/1999 | Vivio et al. .................. | 714/8 |
| 6,148,414 A * | 11/2000 | Brown et al. ................ | 714/9 |
| 6,373,758 B1 * | 4/2002 | Hughes et al. .............. | 365/200 |
| 6,567,950 B1 * | 5/2003 | Bertin et al. ................ | 714/767 |
| 7,493,534 B2 * | 2/2009 | Pomaranski et al. ........ | 714/723 |
| 2008/0270675 A1 * | 10/2008 | Nagaraj et al. .............. | 711/100 |

* cited by examiner

Primary Examiner — Amine Riad (57) ABSTRACT

A system, and a corresponding method, are used to implement rank sparing. The system includes a memory controller and one or more DIMM channels coupled to the memory controller, where each DIMM channel includes one or more DIMMS, and where each of the one or more DIMMs includes at least one rank of DRAM devices. The memory controller is loaded with programming to test the DIMMs to designate at least one specific rank of DRAM devices as a spare rank.

23 Claims, 6 Drawing Sheets

RANK SPARING SYSTEM AND METHOD

BACKGROUND

In modern computer systems, the concept of DIMM (for dual inline memory module) sparing is well known and used by different server chipsets to increase memory system reliability. DIMM sparing requires that at boot time, one DIMM pair (or quad—depending on memory loading rules) per memory controller be set aside as a spare DIMM. If a persistent, correctable error occurs in one of the non-spare DIMMs connected to the same memory controller, data in the failed DIMM is copied to the spare DIMM and the memory system health is restored. While DIMM sparing provides memory redundancy, it does so at the obvious cost of increased memory overhead, as well as other not so obvious drawbacks.

DESCRIPTION OF THE DRAWINGS

The detailed description will refer to the following drawings in which like numerals refer to like items, and in which.

DETAILED DESCRIPTION

Modern computer memories use double data rate (DDR) dynamic RAM (DRAM) technology, with the latest version being DDR3 (for DDR three synchronous). DDR technology means that the data transfer rate is twice the clock rate. DDR3 technology memory can run its bus at four times the speed of the memory cells it contains, albeit at a cost of higher latency. More specifically, the frequencies of DDR3 memory are raised beyond those of DDR2 due to doubling of the data prefetch that was moved from an information storage device to an input/output buffer. While DDR2 DRAM uses 4-bit samples, DDR3 DRAM uses 8-bit prefetch also known as 8n-prefetch. In other words, DDR3 DRAM technology implies doubling of the internal bus width between the actual DRAM core and the input/output buffer. As a result, the increase in the efficient data transfer rate provided by DDR3 DRAM does not require faster operation of the memory core. Only the external buffers start working faster. As for the core frequency of the memory chips, it appears eight times lower than that of the external memory bus and DDR3 buffers (this frequency was four times lower than that of the external bus by DDR2).

These DDR DRAM modules are installed in a dual inline memory module (DIMM). A modern DIMM module may have a memory capacity of 1 GB to 16 GB or more.

A typical DIMM will have 8, 9, 16 or 18 DRAM modules installed in a single rank, depending on the DRAM organization (×4 or ×8) and the DIMM type (ECC or non-ECC). Thus, a single rank DIMM provides eight bytes (64 bits) of data outputs and one byte (8 bits) of ECC. Current DIMMs can have 1, 2, or 4 ranks. Theoretically, the number of ranks on a DIMM could be increased beyond 4, to 8 or more. For example, an ECC DIMM with two ranks may have 18 or 36 DRAM devices installed, half of the DRAM devices belonging to one rank and the other half to the second. The DIMM is then installed into DIMM connectors (sockets) on a computer system motherboard or on a memory riser. The motherboard can be configured to hold any number of DIMMs, subject to the usual constraints of motherboard size, heat loading, and other factors.

A rank represents all the DRAM devices selected when a memory controller executes a memory transaction. A rank can extend across 1, 2, or 4 DIMMs, depending on the memory sub-system architecture.

A DIMM channel represents all the DIMMs connected to the same data bits. A memory controller can control 1, 2, or 4 DIMM channels operating in lockstep. The number of DIMMs on a DIMM channel depends on the memory technology (DDR1, DDR2, DDR3, etc.) and memory sub-system operating frequency. For example, DDR1 technology allows up to four 2-rank DIMMs operating at 200 MT/s on a channel while DDR3 technology allows up to two 4-rank DIMMs per channel operating at 1067 MT/s.

With a multiple DIMM installation, a concept called DIMM sparing is possible. DIMM sparing sets aside one or more DIMM to act as a backup, or spare, should an "active" DIMM encounter an unacceptable number of errors. When this error threshold is reached, a memory controller coupled to the DIMMs copies data from the active, and "bad" DIMM to the spare DIMM. While DIMM sparing provides memory redundancy, it does so at the obvious cost of extra memory overhead. That is, DIMM sparing requires that at least two DIMMs per channel be loaded. Not so obvious costs of this implementation include reduced memory loading and configuration flexibility. For example, DIMM sparing requires that the spare DIMM be of the same capacity, or greater, and use the same number of ranks (same DRAMS) as the DIMM that is being spared. DIMM sparing also requires that all DIMMs on a DIMM channel be of the same type.

As memory sub-system operating frequency increases, the number of DIMMs per DDR channel decreases and the number of ranks per DIMM increases. For example, a DDR2 memory sub-system could have three 2-rank DIMMs per channel; in a DDR3 memory sub-system, only two 4-rank DIMMs can be loaded per channel. This makes traditional DIMM sparing techniques less attractive since memory sub-systems operating at DDR3 speeds could loose half the capacity of the memory sub-system if DIMM sparing is enabled.

Figure 1:
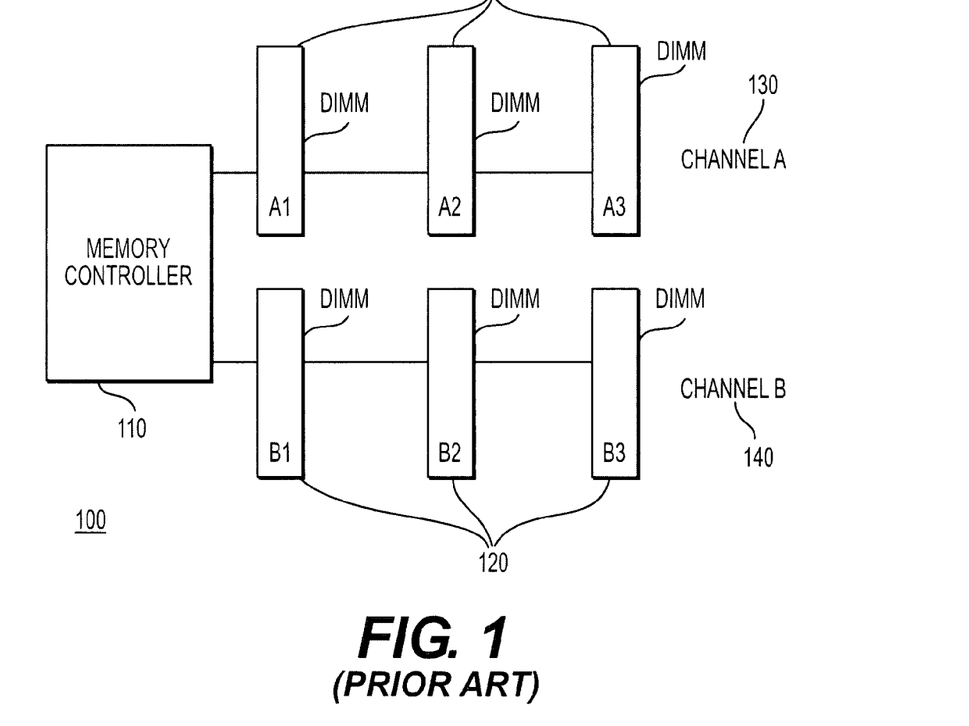
FIG. 1 illustrates a typical memory sub-system of a modern computer architecture.

FIG. 1 illustrates a memory sub-system 100 of a modern computer architecture. The sub-system 100 includes memory controller 110, which is coupled to DIMM channels A 130 and B 140. Each of the DIMM channels includes three DIMMs 120. The DIMMs 120 may be any type of DIMM. For example, the DIMMs could be fully buffered DIMMs (FB-DIMMs), registered DIMMs (R-DIMMs), unbuffered DIMMs (U-DIMMs) or other industry standard or custom DIMM solution.

Figure 2:
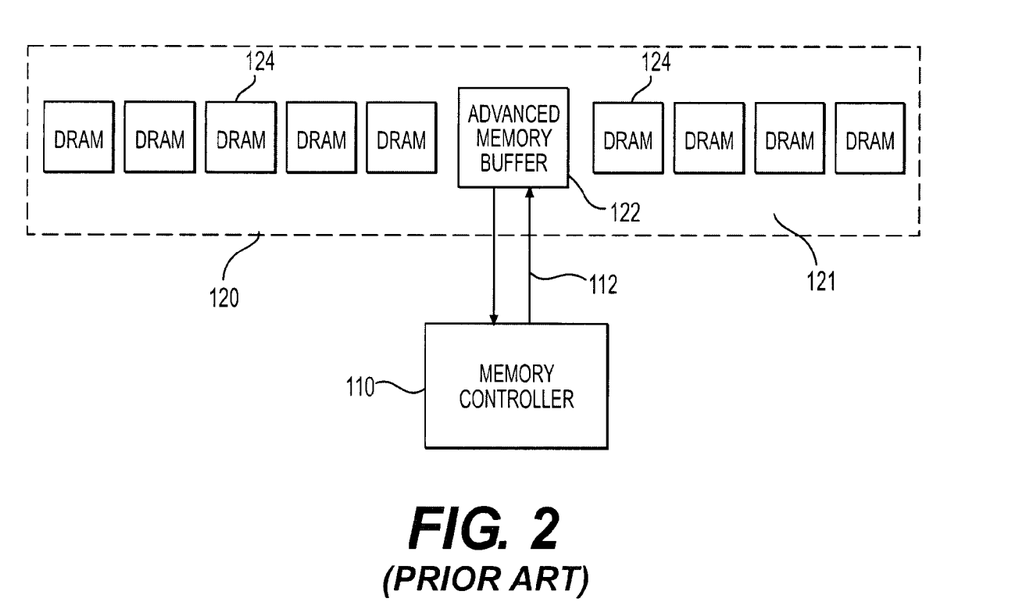
FIG. 2 illustrates a typical ECC fully buffered (FB)-DIMM.

FIG. 2 illustrates a single-rank ECC DIMM 120. The DIMM 120 includes nine DRAM devices 124 arranged on planar 121. Also arranged on the planar 121 could be an extra DIMM interface device (e.g., advanced memory buffer (AMB) for FB-DIMMs and an address/control register for R-DIMMs) 122. The DIMM 120 communicates with the memory controller 110 by way of a memory bus 112. The memory bus technology varies based on the function of the memory controller implementation and the DIMM. For example the FB-DIMM protocol requires serial high speed interfaces southbound (carrying address/control and write data from the memory controller to the DIMM) and northbound (carrying data from the DIMM to the memory controller), while the R-DIMM protocol requires a wide, double pumped parallel bidirectional bus to carry data between the memory controller and the DIMMs on reads and writes and another wide, single-pumped, unidirectional bus to carry address/command between the memory controller and the DIMM.

Figure 3:
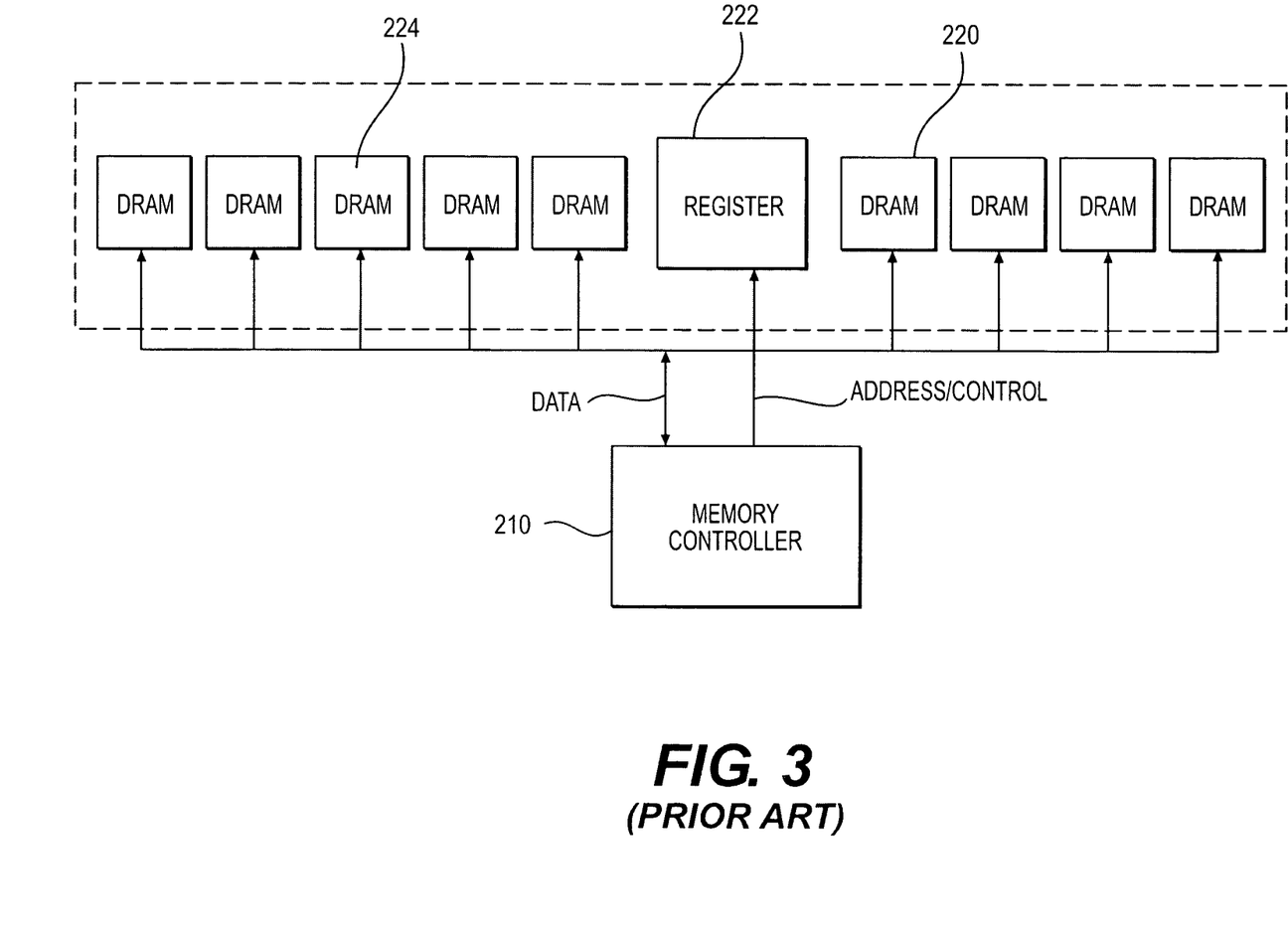
FIG. 3 illustrates a typical ECC registered (R)-DIMM

FIG. 3 illustrates a typical ECC registered (R)-DIMM 220. The DIMM 220 includes DRAM devices 224 and may also include a buffer or register 222. Memory controller 210 is used to control operation of the EC DIMM 220.

Figure 4:
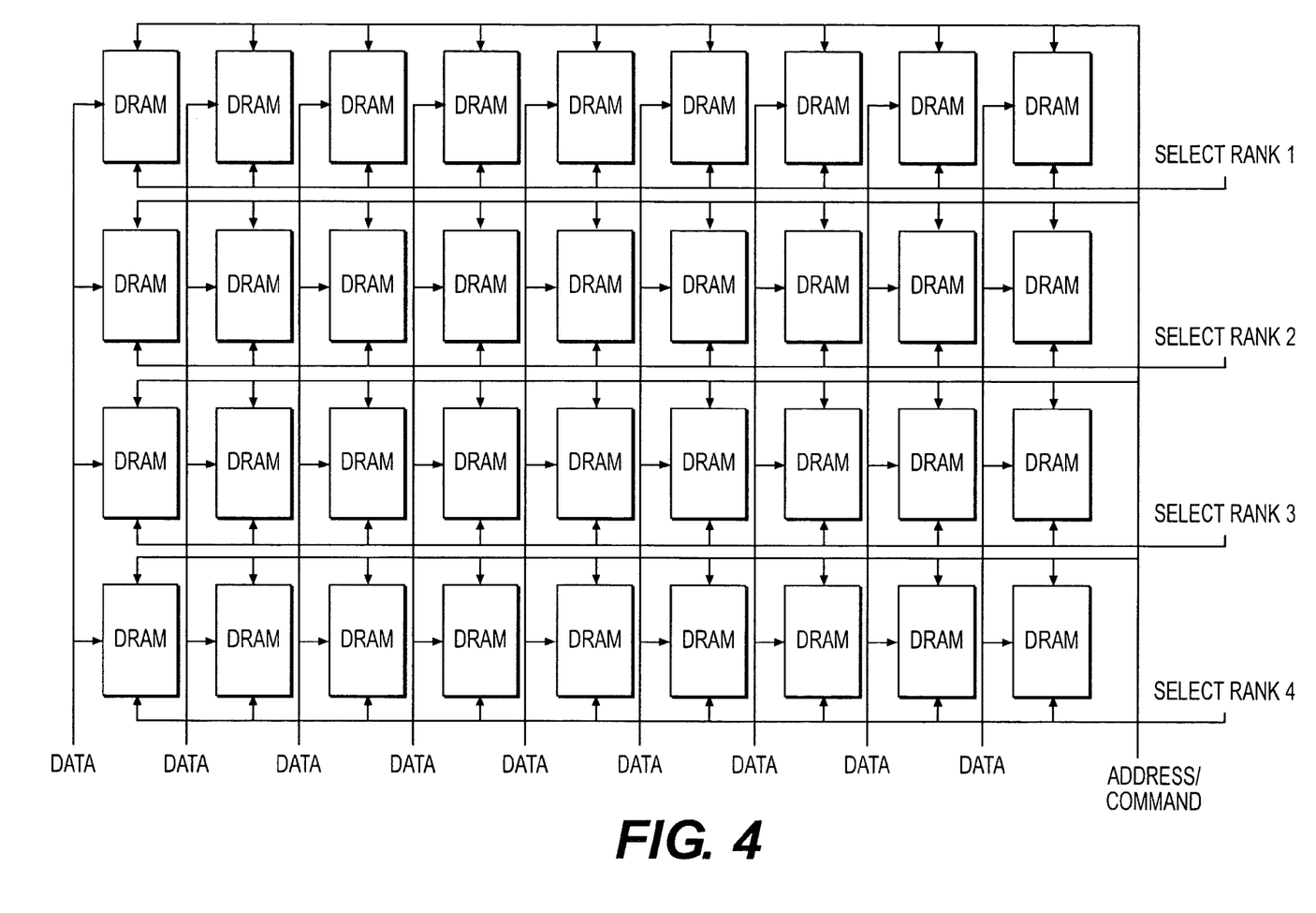
FIG. 4 is a block diagram of an embodiment of a 4-rank DIMM.

FIG. 4 is a block diagram of an embodiment of a 4-rank DIMM. Other configurations are possible to create a 4-rank DIMM.

Regardless of the DIMM architecture, DIMM sparing may be implemented in a memory-subsystem if the sub-system includes a sufficient number of DIMMs of a specific capacity and a specific type. However, such DIMM sparing suffers from the drawbacks mentioned above.

To overcome the disadvantages of DIMM sparing, a memory sub-system is disclosed in which rank sparing, as opposed to DIMM sparing, is implemented. Using rank sparing, all ranks on one channel should be of the same type (for example, a 4-rank DIMM and a 2-rank DIMM can be loaded on the same DIMM channel, and rank sparing can be enabled so long as all the DRAM modules on the two (or more) DIMMs are the same type). Rank sparing also can be implemented if only one 2-rank or one 4-rank DIMM is installed on a DIMM channel. Rank sparing has less stringent DIMM loading restrictions, allowing a user more flexibility in configuring the memory sub-system while providing the same memory reliability as with DIMM sparing. Rank sparing also has a lower memory overhead. In the example of DDR3 DRAM devices, while DIMM sparing may use ½ the memory sub-system capacity for spares, with rank sparing, only ⅛ of the memory sub-system capacity is dedicated to sparing.

Figure 5A:
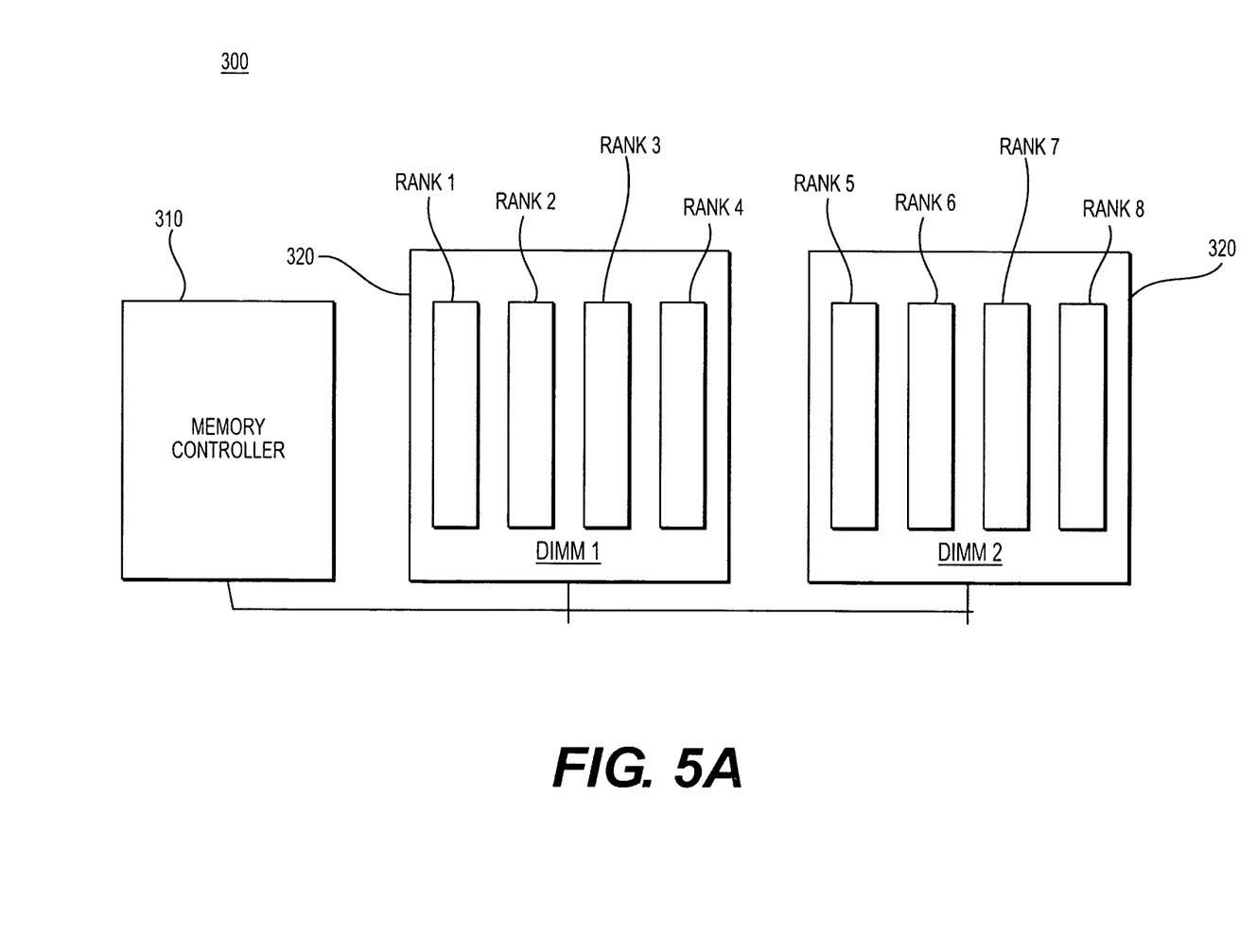
FIGS. 5A and 5B illustrate exemplary memory sub-systems in which rank sparing may be implemented.

FIG. 5A illustrates an exemplary memory sub-system 300 that uses DIMMs in which rank sparing is implemented. The sub-system 300 includes memory controller 310 coupled to a single channel of DIMMs 320. The DIMMs 320 each have loaded four ranks of DRAM devices (ranks 1-8). Although the memory sub-system 300 is shown with two 4-rank DIMMs, the memory sub-system 300 may be implemented with a single 2-rank DIMM, a single 4-rank DIMM, two 1-rank DIMMs, and other DIMM configurations, examples of which are shown in Table 1. Note that in a two channel memory sub-system, when two 1-rank DIMMS are used for rank sparing, the DIMM on channel A may be the spare memory and the DIMM on channel B may be the active memory.

Figure 5B:
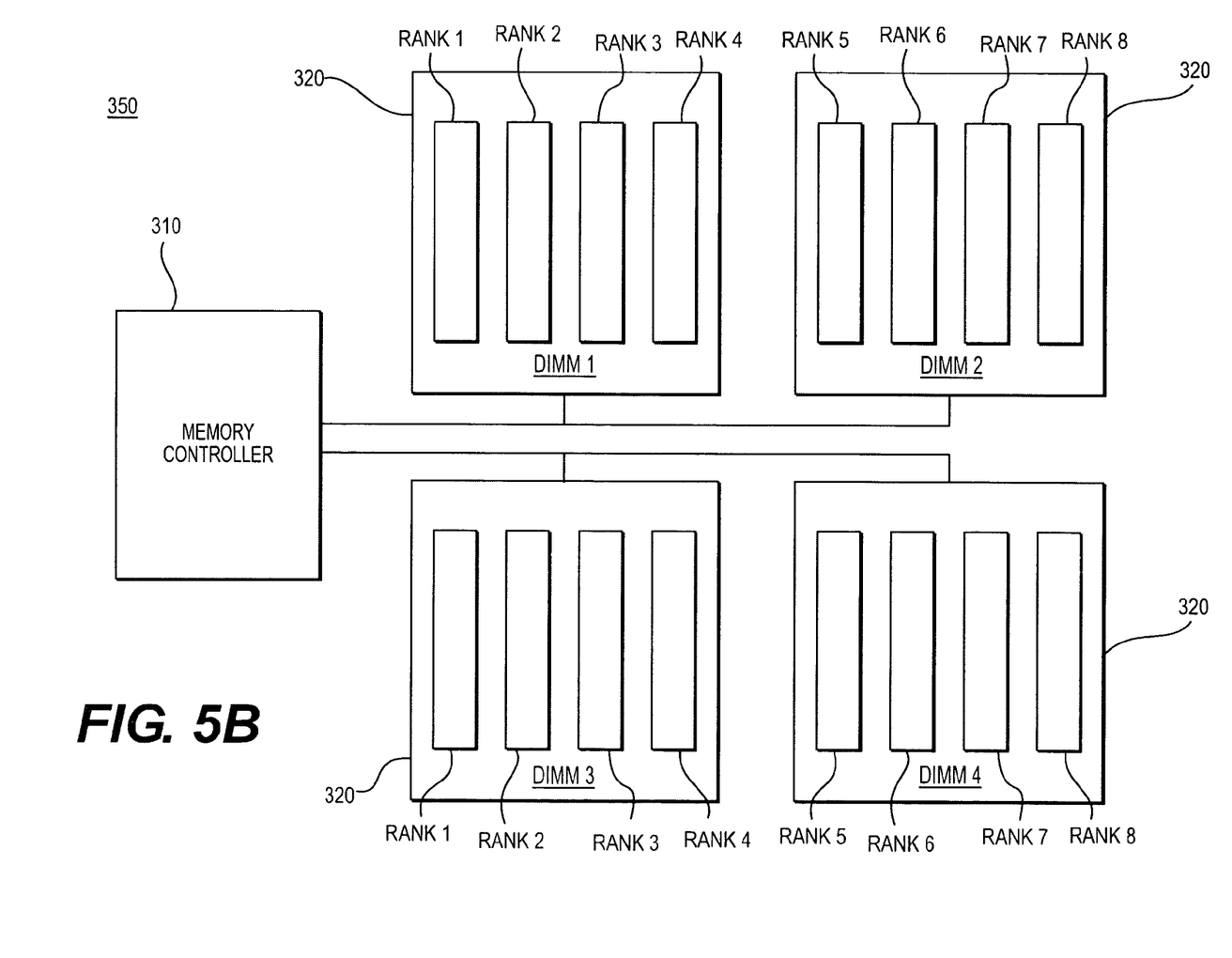

FIG. 5B illustrates an architecture for an alternative exemplary memory sub-system 350, in which two channels of DIMM operate in lock step. The memory sub-system 350 is designed with one rank spread across two DIMMs 320. For example, rank 1 is across DIMM 1 and DIMM 3. The concept embodied in the memory sub-system 350 can extend to any number of DIMM channels operating in lock step.

When rank sparing is enabled, the memory controller 310 tests all available memory and then, for a memory sub-system with more than one rank per DIMM channel, reserves one known good rank per channel as a spare. That is, the memory controller 310 designates at least one specific rank of DRAM devices as spare memory. The remaining ranks are then used for active memory operations. For example, memory controller 310 may reserve the ranks 1 and 5 as spares. Testing and designating spare memory may be executed at boot up of the overall computer system.

For memory sub-system architectures having one 4-rank DIMM, for example, the memory controller 310 tests all four ranks and designates one of the four ranks as a spare. For a single 2-rank DIMM, the memory controller 310 designates one of the two ranks as a spare. For two 1-rank DIMMs, the memory controller designates one of the ranks as a spare.

Enablement of rank sparing may be a user-selectable feature of the memory sub-system 300. That is, a user may direct the enablement of rank sparing, and may disable rank sparing at any time. In an embodiment, rank sparing is a default feature of the memory sub-system 300.

During operation of the memory sub-system 300, should correctable DRAM errors such as DRAM stuck-at bits, row or column failures, or DRAM chip spare events cause one of the active ranks to reach a specified threshold of errors, the memory controller 310 will enable the spare rank. The memory controller 310 copies the memory from the failing, or "bad" rank to the spare rank. After the memory controller 310 completes this copy operation, all memory transactions associated with the "bad" rank are redirected to the spare rank.

Figure 6:
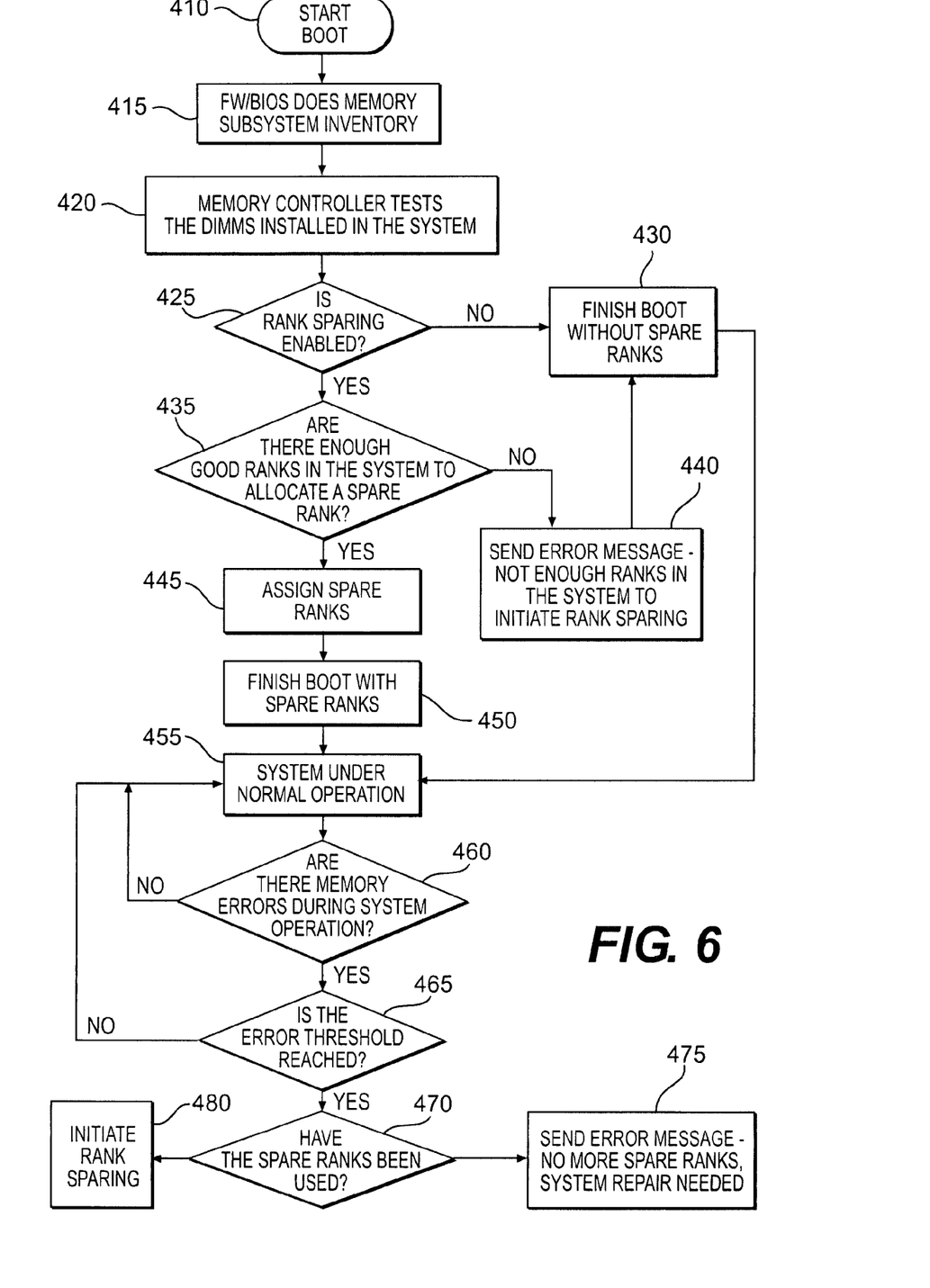
FIG. 6 is a block diagram of an exemplary operation of the memory sub-system of FIG. 5A.

FIG. 6 is a flowchart illustrating an exemplary operation 400 of the memory sub-system 300. In FIG. 6, the operation 400 begins, block 410, with a boot-up command. In block 415, the FW/BIOS executes a memory sub-system inventory to determine the number, locations, and types of installed DIMMs. In block 420, the memory controller 310 tests the DIMMs installed in the memory sub-system 300. The testing is conducted on a per-rank basis. In block 425, the memory controller 310 determines if rank sparing is enabled. If rank sparing is not enabled, the operation 400 moves to block 430, and system boot is completed without spare ranks. Following system boot, the operation moves to block 455 and operation of the system continues.

In block 425, if rank sparing is enabled, the operation 400 moves to block 435 and the memory controller 310 determines if there are enough good ranks left in the memory sub-system 300 to allocate a spare rank. If there is not enough good ranks to allocate a spare, the operation 400 moves to block 440 and the memory controller 310 initiates an error message to alert the user that the memory subsystem 300 does not have enough good ranks to enable rank sparing. The operation 400 then moves to block 430.

In block 435, if there are enough good ranks to allocate a spare, the operation 400 moves to block 445, and one or more spare ranks are assigned. Following assignment of the spare ranks, the system boot concludes, block 450. The system then operates as normal, block 455.

During normal system operation, the memory sub-system 300 checks for memory errors, block 460. When a memory error is detected, the memory controller 310 determines if an error threshold has been reached, block 465. If the threshold has not been reached, operation of the system continues as normal, block 455. If the error threshold has been reached, the operation 400 moves to block 470 and the memory controller 310 determines if the spare rank(s) have been used. If the spare rank(s) have been used, the operation 400 moves to block 475 and the memory controller 310 initiates an error message. If the spare rank(s) have not been used, the operation 400 moves to block 480, and the memory controller 310 initiates rank sparing.

In an alternate embodiment, upon designation of a spare rank as an active rank, and following copying of memory, the operation 400 returns to block 425, and the memory controller 310 determines if there are sufficient number of ranks to allow operation with rank sparing.

TABLE 1

Comparison of DIMM and Rank Sparing

| Configuration | | | |
|---|---|---|---|
| No. of DIMMs/ch | DIMM Type | DIMM Sparing | Rank Sparing |
| 1 | 1 rank | Not supported | Not supported |
| 1 | 2 rank | Not supported | Supported (50% usable memory capacity) |
| 1 | 4 rank | Not supported | Supported (75% usable memory capacity) |
| 2 | 1 rank | Supported (50% usable memory capacity) | Supported (50% usable memory capacity) |
| 2 | 1 rank + 2 rank | Supported (33% usable memory capacity) | Supported (66% usable memory capacity) |
| 2 | 1 rank + 4 rank | Supported (20% usable memory capacity) | Supported (80% usable memory capacity) |
| 2 | 2 rank | Supported (50% usable memory capacity) | Supported (75% usable memory capacity) |
| 2 | 2 rank + 4 rank | Supported (33% usable memory capacity) | Supported (83% usable memory capacity) |
| 2 | 4 rank | Supported (50% usable memory capacity) | Supported (87.5% usable memory capacity) |

The table above can be extended for memory subsystems with more than 8 ranks per memory subsystem as follows:

| Configuration | | | |
|---|---|---|---|
| No. of DIMMs/ch | DIMM Type | DIMM Sparing | Rank Sparing |
| 3 | 1 rank | Supported (66% usable memory capacity) | Supported (66% usable memory capacity) |
| 3 | 2 rank | Supported (66% usable memory capacity) | Supported (83% usable memory capacity) |
| 3 | 4 rank | Supported (66% usable memory capacity) | Supported (91% usable memory capacity) |
| 3 | 1 × 1 rank + 2 × 2 rank | Supported (66% usable memory capacity) | Supported (80% usable memory capacity) |
| 3 | 2 × 1 rank + 1 × 2 rank | Supported (50% usable memory capacity) | Supported (75% usable memory capacity) |
| 3 | 1 × 1 rank + 2 × 4 rank | Supported (55% usable memory capacity) | Supported (89% usable memory capacity) |
| 3 | 2 × 1 rank + 1 × 4 rank | Supported (33% usable memory capacity) | Supported (83% usable memory capacity) |
| 3 | 1 × 2 rank + 2 × 4 rank | Supported (55% usable memory capacity) | Supported (89% usable memory capacity) |
| 3 | 2 × 2 rank + 1 × 4 rank | Supported (50% usable memory capacity) | Supported (87.5% usable memory capacity) |
| 3 | 1 × 1 rank + 1 × 2 rank + 1 × 4 rank | Supported (43% usable memory capacity) | Supported (86% usable memory capacity) |
| 4 | 1 × 1 rank + 3 × 2 rank | Supported (71% usable memory capacity) | Supported (86% usable memory capacity) |
| 4 | 2 × 1 rank + 2 × 2 rank | Supported (67% usable memory capacity) | Supported (83% usable memory capacity) |
| 4 | 3 × 1 rank + 1 × 2 rank | Supported (60% usable memory capacity) | Supported (80% usable memory capacity) |
| 4 | 1 × 1 rank + 3 × 4 rank | Supported (69% usable memory capacity) | Supported (92% usable memory capacity) |
| 4 | 2 × 1 rank + 2 × 4 rank | Supported (60% usable memory capacity) | Supported (90% usable memory capacity) |
| 4 | 3 × 1 rank + 1 × 4 rank | Supported (43% usable memory capacity) | Supported (86% usable memory capacity) |
| 4 | 1 × 2 rank + 3 × 4 rank | Supported (71% usable memory capacity) | Supported (93% usable memory capacity) |
| 4 | 2 × 2 rank + 2 × 4 rank | Supported (67% usable memory capacity) | Supported (92% usable memory capacity) |
| 4 | 3 × 2 rank + 1 × 4 rank | Supported (60% usable memory capacity) | Supported (90% usable memory capacity) |
| 4 | 1 × 1 rank + 1 × 2 rank + 2 × 4 rank | Supported (64% usable memory capacity) | Supported (91% usable memory capacity) |
| 4 | 1 × 1 rank + 2 × 2 rank + 1 × 4 rank | Supported (55% usable memory capacity) | Supported (89% usable memory capacity) |
| 4 | 2 × 1 rank + 1 × 2 rank + 1 × 4 rank | Supported (50% usable memory capacity) | Supported (87.5% usable memory capacity) |

Usable memory capacity is calculated assuming that the DRAM devices installed on the 1 rank, 2 rank and 4 rank DIMMs are all the same size and type, for example 1 GB×4. For the DIMM sparing method, the spare DIMM has to be the largest DIMM installed. For the rank sparing method, all the ranks are considered equal based on the assumption above. The concept applies the same way if the ranks are not equal in capacity; in this case one of the largest ranks will have to be selected as the spare.

Rank sparing enabled in 2-rank, 4-rank, or larger DIMM memory sub-systems offers the following advantages:

restores the health of the memory sub-system after DRAM correctable errors occur without the need to replace the failing DIMM;

protects the memory sub-system even when a single DIMM per channel is loaded because the spare rank can be on the same DIMM as the rank that is being spared/replaced;

increases usable memory capacity compared to DIMM sparing;

allows for better memory sub-system performance compared with memory mirroring, which requires ½ the available memory to be set aside for mirroring;

increases DIMM loading flexibility;

results in customer cost savings due to more efficient use of memory; and increases memory sub-system reliability for cases where only a single chip-spare is supported.

We claim:

1. A system for implementing rank sparing, comprising:
    a memory controller; and
    one or more DIMM channels coupled to the memory controller, wherein each DIMM channel comprises one or more DIMMs, wherein each of the one or more DIMMs comprises at least one rank of DRAM devices, and wherein the memory controller comprises programming to test all the DIMMs (ranks) installed in the DIMM channels to designate at least one specific rank of DRAM devices as a spare rank.

2. The system of claim 1, wherein the memory controller comprises:
    threshold programming to determine if an error threshold is reached in any active DIMM ranks; and
    rank test programming to test viability of all DIMM ranks upon boot up of a corresponding computer system.

3. The system of claim 1, wherein the DIMMs installed in the DIMM channels each are 1-rank DIMMs.

4. The system of claim 1, wherein the DIMMs installed in the DIMM channels each are 2-rank DIMMs.

5. The system of claim 1, wherein the DIMMs installed in the DIMM channels comprise 1-rank DIMMs and 2-rank DIMMs.

6. The system of claim 1, where in the DIMMs installed in the DIMM channels comprise 2-rank DIMMs and 4-rank DIMMs.

7. The system of claim 1, where in the DIMMs installed in the DIMM channels are 4-rank DIMMs.

8. The system of claim 1, wherein the DIMMs installs in the DIMM channels comprise 1-rank, 2-rank and 4-rank DIMMs.

9. The system of claim 1, wherein the memory controller comprises programming to issue an alert to a user when a rank is not available for sparing.

10. The system of claim 1, wherein rank sparing is enabled as an optional feature.

11. A method, implemented in a memory-subsystem of a computer, for rank sparing, the method, comprising:
    at a memory controller of the memory sub-system, receiving a boot-up notification;
    in response to the boot-up notification, testing each rank of memory in the memory sub-system to determine availability of ranks for active operations and sparing operations; and
    designating one or more specific ranks as spare ranks, wherein operation with rank sparing increases reliability of the memory sub-system.

12. The method of claim 11, wherein the memory sub-system, comprises:
    a memory controller;
    one or more DIMM channels coupled to the memory controller, wherein the DIMM channels comprise one or more channel DIMMs, and wherein each of the one or more channel DIMMs comprises at least one rank of DRAM devices, where in the memory controller comprises programming to test the channel DIMMs to designate at least one specific rank of DRAM modules as a spare rank.

13. The memory of claim 11, wherein the memory controller determines an insufficient number of ranks for both sparing and active operations, the method further comprising:
    sending a warning message; and
    implementing memory operation without rank sparing.

14. The method of claim 11, further comprising:
    monitoring operation of the memory sub-system for occurrence of correctable faults;
    comparing a determined number of correctable faults to a threshold value; and
    when the threshold value is reached, enabling one or more spare ranks.

15. The method of claim 14, wherein enabling one or more spare ranks, comprises:
    copying the memory contents from a failing rank to one of the spare ranks; and
    redirecting memory transactions from the failing rank to the one of the spare ranks.

16. The method of claim 12, wherein the channel DIMMs each are 1-rank DIMMs.

17. The method of claim 12, wherein the channel DIMMs each are 2-rank DIMMs.

18. The method of claim 12, wherein the channel DIMMs comprise 1-rank DIMMs and 2-rank DIMMs.

19. The method of claim 12, wherein the channel DIMMs comprise 2-rank DIMMs and 4-rank DIMMs.

20. The method of claim 12, wherein the channel DIMMs are 4-rank DIMMs.

21. The method of claim 12, wherein the channel DIMMs comprise 1-rank, 2-rank and 4-rank DIMMs.

22. The method of claim 12, further comprising:
    determining if sufficient additional ranks are available for sparing and active memory operations; and
    is sufficient ranks are available, re-initiating rank sparing.

23. A computer memory enabling rank sparing, comprising:
    a plurality of memory devise arranged into two or more ranks; and
    a memory controller coupled to each of the two or more ranks, the controller, comprising:
    means for inventorying and testing the memory devices to determine an availability of one or more ranks for rank sparing,
    means for designating one or more ranks for sparing, and
    means for implementing rank sparing using the one or more designated ranks.

* * * * *

UNITED STATES PATENT AND TRADEMARK OFFICE
CERTIFICATE OF CORRECTION

Page 1 of 1

PATENT NO. : 8,892,942 B2
APPLICATION NO. : 11/878860
DATED : November 18, 2014
INVENTOR(S) : Lidia Warnes et al.

It is certified that error appears in the above-identified patent and that said Letters Patent is hereby corrected as shown below:

On the Title page, in item (57), Abstract, in column 2, line 6, delete "DIMMS" and insert -- DIMMs --, therefor.

In The Claims

In column 7, line 48, in Claim 6, delete "where in" and insert -- wherein --, therefor.

In column 7, line 51, in Claim 7, delete "where in" and insert -- wherein --, therefor.

In column 8, line 14, in Claim 12, delete "where in" and insert -- wherein --, therefor.

In column 8, line 54, in Claim 23, delete "devise" and insert -- devices --, therefor.

Signed and Sealed this
Twenty-third Day of June, 2015

Michelle K. Lee
*Director of the United States Patent and Trademark Office*